United States Patent [19]

Haaland

[11] Patent Number: 5,403,617
[45] Date of Patent: Apr. 4, 1995

[54] HYBRID PULSED VALVE FOR THIN FILM COATING AND METHOD

[75] Inventor: Peter D. Haaland, Centerville, Ohio

[73] Assignee: Mobium Enterprises Corporation, Dayton, Ohio

[21] Appl. No.: 121,726

[22] Filed: Sep. 15, 1993

[51] Int. Cl.$^6$ ............................................. B05D 1/02
[52] U.S. Cl. ................................... 427/180; 427/421;
118/300; 118/323; 239/8; 239/11; 239/99;
239/101; 239/102.2
[58] Field of Search ................ 427/421, 180; 118/300,
118/323; 239/8, 11, 99, 101, 102.2

[56] References Cited

U.S. PATENT DOCUMENTS

| | | | |
|---|---|---|---|
| 3,739,393 | 6/1973 | Lyon et al. | 346/1 |
| 3,840,391 | 10/1974 | Spitz et al. | 427/565 |
| 3,868,698 | 2/1975 | Dressler | 346/75 |
| 4,019,188 | 4/1977 | Hochberg et al. | 346/75 |
| 4,290,384 | 9/1981 | Ausschnitt et al. | 427/600 |
| 4,407,450 | 10/1983 | Chegolya et al. | 239/8 |
| 4,462,760 | 7/1984 | Sarich et al. | 417/54 |
| 4,659,013 | 4/1987 | Ledebuhr et al. | 239/8 |
| 4,765,540 | 8/1988 | Yie | 239/8 |
| 4,970,985 | 11/1990 | Slautterback | 239/8 |
| 4,996,080 | 2/1991 | Daraktchiev | 427/57 |
| 5,114,748 | 5/1992 | Tada et al. | 427/421 |
| 5,150,836 | 9/1992 | McKay et al. | 239/5 |
| 5,166,000 | 11/1992 | Singh et al. | 427/421 |

OTHER PUBLICATIONS

G. Switzer, "A Versatile system for Stable Generation of Uniform Droplets", Reviews of Scientific Instruments (1991).

*Primary Examiner*—Shrive Beck
*Assistant Examiner*—Brian K. Talbot
*Attorney, Agent, or Firm*—Thompson, Hine and Flory

[57] ABSTRACT

An apparatus for coating a substrate with a relatively thin, uniform film of a liquid on a substrate with a minimum of waste. The apparatus includes a droplet generator capable of generating droplets of the liquid at a predetermined rate and of a predetermined size, a pulsed gas jet and a computer control which sequentially triggers the droplet generator and gas jet such that droplets are generated, then contacted by the gas jet, which accelerates the droplets and propels the droplets to impact and coat the substrate. In a preferred embodiment of the invention, the droplet size and velocity are selected such that the droplets break up upon impact with the substrate without splashing or rippling. The apparatus and method are ideal for coating semiconductor wafers with a photoresist solution. Droplets with uniform size and controlled trajectories are generated, in one embodiment, with a piezoelectric droplet generator, and then accelerated to precisely defined velocities by the pulsed gas jet toward the surface to be coated. The kinetic energy of the droplets is adjusted to overcome the free energy associated with surface tension on impact. The collision of the droplet thus results in a uniform, thin coating of photoresist or other coating solution which may then be further processed by conventional techniques.

12 Claims, 1 Drawing Sheet

HYBRID PULSED VALVE FOR THIN FILM COATING AND METHOD

BACKGROUND

The present invention relates to systems and processes for coating solid surfaces with thin layers of a liquid, solution, or suspension and, more particularly, the fabrication of uniform layers of photoresist for lithography of semiconductor and other electronic materials.

Lithography of semiconductor materials such as silicon or gallium arsenide wafers requires the application of a very uniform, thin (typically less than $10^{-5}$ meter) layer of photoresist which is subsequently exposed to light through a mask followed by selective etching of either the exposed or unexposed material in a liquid bath or plasma. In order to obtain high resolution patterns, the photoresist must be less than 10 microns thick with minimal variation of thickness over the entire wafer.

A typical process employs spin-coating, in which a puddle or mist of liquid polymer solution is deposited onto a substrate, after which the substrate is spun at high speed (typically 1000–3000 rpm) so that shear forces lead to a uniform and thin film. An example of such a process is shown in Daraktchiev U.S. Pat. No. 4,996,080, which discloses a coating process in which a liquid photoresist composition is atomized, and the atomized spray droplets are permitted to settle by gravity onto a substrate surface, which is spun at between 500 and 6000 rpm. The spinning step may occur either simultaneously with the deposition of the atomized droplets, or subsequent to the deposition.

However, an inherent disadvantage with such coating processes is that it can waste as much as 95% or more of the photoresist solution, which cannot be recycled. Further, such spin-coating processes typically do not work well on substrates which are not circular, not flat, or are larger than a few tens of centimeters in diameter. Accordingly, there is a need for an apparatus and process for coating solid surfaces with thin layers of a liquid, solution or suspension which minimizes the amount of coating material wasted, and which can be employed satisfactorily on surfaces which are not circular, flat or smaller than a few tens of centimeters in diameter.

SUMMARY OF THE INVENTION

The present invention is a method and apparatus for depositing a thin, uniform film of material, in particular photoresist material, on a substrate in which a larger fraction of the deposited material is utilized than in prior art processes, and which can apply uniform coatings of film on relatively large, irregular and eccentric substrates. The apparatus of the present invention includes a hybrid atomizer having two components: a pulsed liquid droplet generator and a pulsed gas valve. The droplet generator produces droplets of uniform size and at a predetermined rate, and the gas valve is oriented to release bursts of pressurized gas which contact and propel the droplets to the target substrate.

The advantages of the method and apparatus of the invention are that the rate of droplet formation and velocity of the droplets can be controlled with high precision. Consequently, kinetic energy is imparted to the droplets which is sufficient to overcome the cohesive surface tension forces holding the droplets together so that the droplets spread and "wet" the surface of the substrate at impact, but is below the level of energy which would cause splashing or ripples in the layer of deposited film.

In a preferred embodiment of the invention, the droplet generator and the gas valve are actuated by a computer control, which synchronizes the production of particles and bursts of gas from the valve. In another embodiment of the invention, the droplet generator and gas valve each include a plurality of orifices, paired so that an array is formed. Such a device is capable of coating large areas quickly and efficiently. Consequently, the invention may be considered a digitally programmable paintbrush.

Accordingly, it is an object of the present invention to provide a method and apparatus for depositing a thin film on a substrate; a method and apparatus for depositing a thin film on a substrate in which the amount of material wasted in the coating process is minimized; a method and apparatus for coating a substrate in which the quality of the film coating remains high even when the coating is applied to uneven, eccentric or relatively large substrates; a method and apparatus for coating a substrate in which droplets of coating material and droplet velocity can be controlled with high precision; and a method and apparatus for coating a substrate in which the coating mechanism may comprise an array which can coat large areas evenly and rapidly.

Other objects and advantages of the present invention will be apparent from the following description, the accompanying drawings and the appended claims.

DETAILED DESCRIPTION

The physics of a single bristle will be described first, after which the use of a one or two dimensional array of bristles for coating large areas efficiently will be described.

Figure 1:
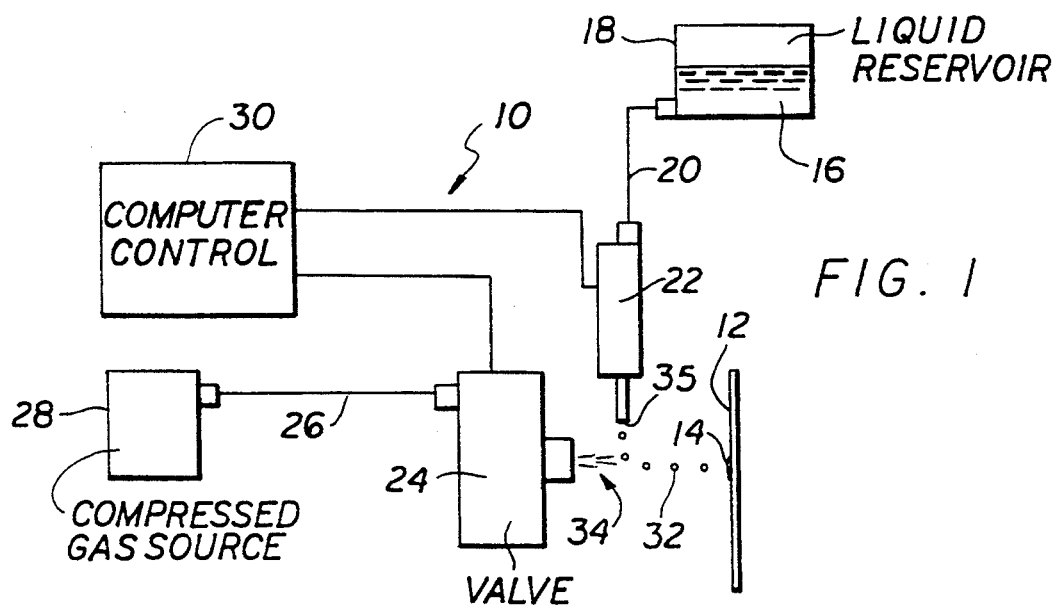
FIG. 1 is a schematic diagram of a preferred embodiment of the coating apparatus of the present invention.
Figure 2:
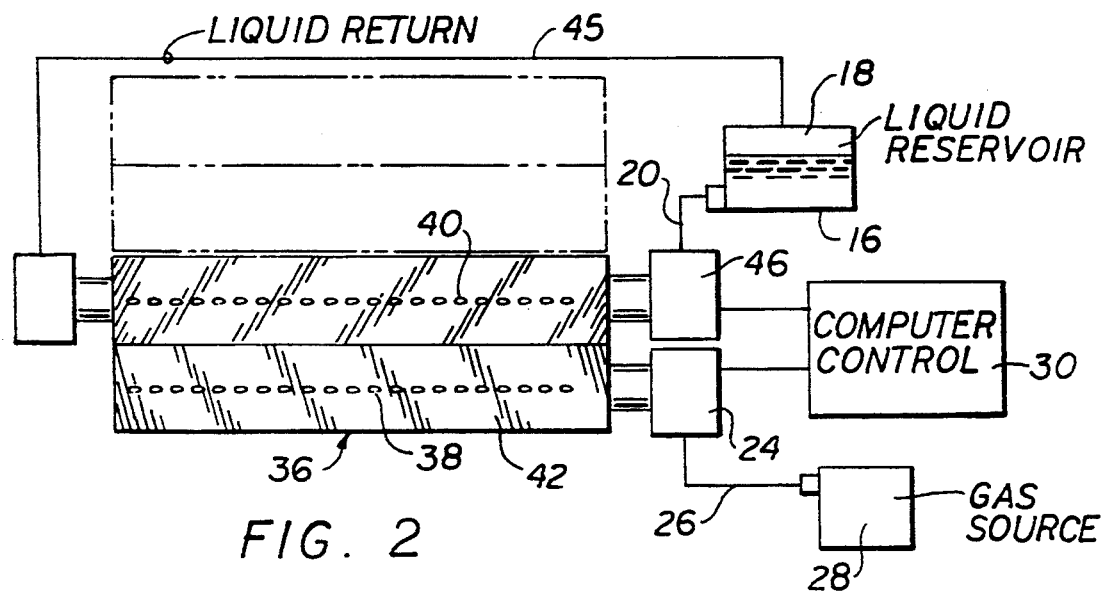
FIG. 2 is a schematic diagram of an alternate embodiment of the invention in which the coating component is in the form of an array.
Figure 3:
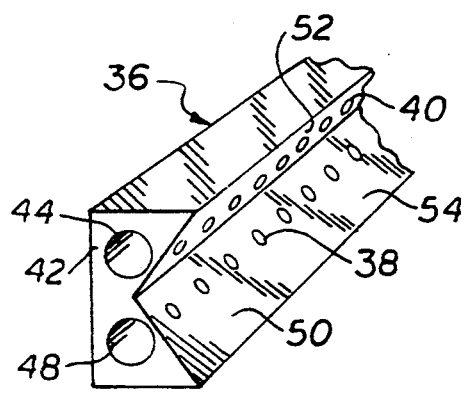
FIG. 3 is a detail in perspective of the coating head of the embodiment of FIG. 2.

As shown in FIG. 1, the apparatus of the present invention, generally designated 10, is used to coat a plate substrate 12 with a film 14 of a solution 16. The solution 16 may be a liquid, solution or suspension and is contained in a reservoir 18. The reservoir is connected by liquid supply line 20 to a droplet generator 22. A preferred droplet generator is shown and described in G. Switzer, "A versatile system for stable generation of uniform droplets," *Reviews of Scientific Instruments*, pp. 2765–71 (1991), the disclosure of which is incorporated herein by reference. Alternately, a thermal ink jet or electrospray droplet source may also be employed without departing from the scope of the invention, so long as the distributions of droplet sizes and velocities are narrow.

A pulsed gas valve 24 is connected by gas supply line 26 to a source 28 of gas under pressure, and is oriented to direct blast of gas at the substrate 12. The valve 24 preferably is a Lasertechnics model LPV pulsed supersonic molecular beam valve, manufactured by Lasertechnics, Inc., Albuquerque, N. Mex. Alternately, the valve 24 may be one of the magnetic solenoid gas valves, such as the Series 9 high-speed solenoid valve manufactured by General Valve Corporation, Fairfield, N.J.

The droplet generator 22 and gas valve 24 are actuated by a computer control 30. Control 30 coordinates the generation of droplets 32 of solution 16 with the production of a gas puff 34 by valve 24.

The apparatus 10 of FIG. 1 operates as follows. Control 30 generates a trigger to actuate droplet generator 22 to produce a liquid droplet 32 of precisely defined size and velocity from orifice 35. After a programmed delay, control 30 sends a trigger to pulsed gas valve 24, which results in a precisely defined puff of gas 34 that flows around the droplet 32. The droplet 32 is accelerated by viscous drag to a velocity which makes its kinetic energy, when it strikes the substrate 12, large enough to overcome the droplet's surface tension. The result is a broken droplet which wets the substrate and spreads to an extent determined by energy balance in the droplet surface collision.

The resulting puff of gas 34 efficiently accelerates the droplet 32 toward the substrate in part because the drag coefficient for small particles is inversely proportional to the Reynolds number of the flow. The flow velocity of the gas puff 34, and thus the velocity of droplet 32, are varied by adjusting the pressure generated by gas source 28 behind the gas valve 24, as well as the distance and orientation of the valve with respect to the substrate 12. The radius of the droplet 32 may be controlled by varying the size of the orifice 35.

The energy which holds the droplet 32 in a spherical shape depends on the radius r of the droplet and the surface tension $\sigma$ of the liquid: $E_s = 4\pi\sigma r^2$. By altering the velocity of the droplet, the kinetic energy is varied: $E_k = 4\pi\rho v^2 r^3/3$; where v is the velocity of the droplet 32 and $\rho$ is the liquid mass density. Thus, when the ratio $\rho v^2 r/3\sigma < 1$, the droplet 32 bounces off of the substrate 12. In contrast, when the ratio is very much greater than one, the excess kinetic energy must be dissipated by splashing of the solution 16 or creating surface waves on the film 14.

The apparatus 10 allows one to vary v over a wide range while controlling r so that conditions where the ratio is just enough greater than one to give uniform films may be identified. How much greater than one this ratio must be for successful film deposition depends on precisely how well the solution 16 wets the substrate 12, a factor which depends intimately on many variables, such as surface roughness and chemical pretreatment. The essential point is that the invention permits detailed control of r and v of the droplets 32 so that optimal conditions may be reproducibly identified for specific coating solutions and substrates.

The single bristle shown in FIG. 1 and described in the preceding paragraphs is easily generalized to a one dimensional housing array 36 of hybrid nozzles as shown, for example, in FIG. 2. An acceptable multi-orifice array is also shown and described in Lyon et al. U.S. Pat. No. 3,739,393, the disclosure of which is incorporated herein by reference. One might employ individual piezoelectric drivers for each gas orifice 38 and liquid orifice 40 to achieve fine control for deposition of layers of solution with programmed film thickness variations. However, the preferred mode for photoresist application with this embodiment permits multiple orifices to be driven by a single pulsed driver.

Liquid solution 16 is fed into the liquid chamber 42 of the housing array 36 through cylindrical channel 44 (see FIG. 3) and forms meniscuses at the ends of the pinholes 40 (shown enlarged for clarity) which are connected to the channel. Alternately, the channel 44 may be rectangular in cross section. The liquid chamber 42 preferably includes a recirculation line 45 from the end of the channel 44 back to the reservoir 18; however, it is possible to provide a liquid chamber 42 without a recirculation line 45.

An acoustic wave generated by a piezoelectric driver 46 is launched down the channel 44, breaks the meniscuses and liberates a droplet (not shown) from each pinhole 40. Alternately, a shock wave could be produced by driver 46. A suitable driver 46 is shown and described in Dressler U.S. Pat. No. 3,868,698, the disclosure of which is incorporated herein by reference. After a programmed delay, a pulse of gas is admitted by valve 24 through cylindrical channel 48 in a gas chamber 50 and a second array of pinholes 38 or nozzles, which are connected to channel 48. A shaped slot might also be employed, and not depart from the scope of the invention. The resulting gas flow accelerates the droplets toward a substrate (not shown) as in the single bristle example of FIG. 1.

As shown in FIGS. 2 and 3, the orifices 38, 40 of the liquid and gas chambers of the array housing are formed in angled faces 52, 54 which form an acute angle with respect to each other, which facilitates the projection of droplets into the paths of the gas jets from orifices 38. Further, the orifices 38, 40 are paired in one-to-one correspondence such that each droplet is projected into the path of a corresponding gas jet from orifice 38. A two dimensional array may be formed, for example, by stacking a series of one-dimensional arrays 36 with independent or coupled drivers 24, 46.

Very small droplet radii and high velocities may be achieved by causing a supersonic expansion from the gas valve 24. At high Reynolds numbers, a shock may be generated which can cause distortion or breakup of the liquid droplets. Use of the shock or gas flow to force distortion or breakup of the droplets is a second mode of operating the hybrid valve 10.

While the forms of apparatus and methods herein described constitute preferred embodiments of the invention, it is to be understood that the invention is not limited to these precise forms of apparatus, and that changes may be made therein without departing from the scope of the invention.

What is claimed is:

1. A method of coating a thin film on a substrate comprising the steps of:

generating a droplet of a liquid to coat said substrate; and generating a pulse of gas to contact and envelop said droplet, whereby said droplet is accelerated and propelled toward said substrate at a velocity at impact sufficient to cause said droplet to break up but being insufficient to cause splashing or rippling of said coating.

2. The method of claim 1 wherein said droplet generating step includes the step of generating a droplet having a diameter such that, at impact with said substrate, said droplet breaks up without splashing or rippling.

3. The method of claim 1 wherein said droplet generating step includes the step of actuating a piezoelectric driver to generate a shock wave in a channel to eject meniscuses of said liquid to be contacted and propelled by said gas pulse.

4. The method of claim 1 wherein said step of generating a droplet further comprises the step of generating a stream of said droplets, each having a substantially uniform drop size; and said step of accelerating said droplets propels said droplets to said substrate at a substantially uniform velocity.

5. A method of coating a thin film on a substrate comprising the steps of:
   simultaneously generating a plurality of droplets of a liquid to coat said substrate; and
   subsequent to said droplet generating step, generating a plurality of pulses of gas to contact and envelop said droplets, whereby said droplets are accelerated and propelled toward said substrate at a velocity at impact sufficient to cause break up of said droplets but insufficient to cause droplet splashing or rippling of said coating.

6. The method of claim 5 wherein said step of generating a plurality of droplets generates droplets having a substantially uniform drop size and said step of accelerating said droplets propels said droplets to said substrate at a substantially uniform velocity.

7. A method of coating a thin film on a substrate comprising the steps of:
   simultaneously generating a plurality of droplets of a liquid to coat said substrate; and
   subsequent to said droplet generating step, generating a plurality of pulses of gas to contact and envelop said droplets, whereby said droplets are accelerated and propelled toward a substrate at a ratio $\rho v^2 r/3\sigma$ which is slightly greater than 1, where $\rho$ is the mass density of said liquid, v is the velocity of said droplets, r is the radii of said droplets and $\sigma$ is the surface tension of said liquid.

8. A method of coating a thin film on a substrate comprising the steps of:
   generating a droplet of a liquid to coat said substrate; and
   accelerating said droplet relative to said substrate at a ratio of $\rho v^2 r/3\rho$ which is slightly greater than 1, where p is the mass density of said liquid, v is the velocity of said droplets, r is the radii of said droplets and $\sigma$ is the surface tension of said liquid, whereby said droplet impacts said substrate such that surface tension of said droplet is broken to form a uniform film on said substrate without ripples or splashing.

9. A method of coating a thin film on a substrate comprising the steps of:
   generating a droplet of a liquid to coat said substrate; and
   accelerating said droplet relative to said substrate sufficiently such that said droplet impacts said substrate at a velocity so that surface tension of said droplet is broken to form a uniform film substantially without forming ripples or splashing.

10. A method of coating a thin film on a substrate comprising the steps of:
    generating a droplet of a liquid to coat said substrate; and
    accelerating said droplet relative to said substrate to impact said substrate, by means other than gravity, at impact whereby said droplet has a relative velocity such that said droplet impacts said substrate and is broken up as a result of said impact to form a film of uniform thickness substantially without forming ripples or splashing.

11. A method of coating a thin film on a substrate comprising the steps of:
    simultaneously generating a plurality of droplets of a liquid from a plurality of forming means to coat said substrate; and
    subsequent to said droplet generating step, generating a plurality of pulses of gas to contact and envelop said droplets in a one-to-one correspondence, whereby said droplets are accelerated and propelled toward a substrate at a velocity such that said droplets are broken up upon impact of said substrate to form a uniform film substantially without forming ripples or splashing.

12. The method of claim 11 wherein said step of generating a plurality of droplets generates droplets having a substantially uniform drop size and said step of accelerating said droplets propels said droplets to said substrate at a substantially uniform velocity.

* * * * *

UNITED STATES PATENT AND TRADEMARK OFFICE
CERTIFICATE OF CORRECTION

PATENT NO. : 5,403,617
DATED : April 4, 1995
INVENTOR(S) : Peter D. Haaland

It is certified that error appears in the above-identified patent and that said Letters Patent is hereby corrected as shown below:

10, col. 6, line 18, after "substrate" a --,-- should be inserted;

in line 19, after "substrate", the "," should be omitted;

in line 19, after "gravity", the "," should be omitted; and in line 20, after "impact", a --,-- should be inserted.

Signed and Sealed this

Fifth Day of September, 1995

Attest:

BRUCE LEHMAN

Attesting Officer

Commissioner of Patents and Trademarks